United States Patent
Jong et al.

(10) Patent No.: US 8,097,476 B2
(45) Date of Patent: Jan. 17, 2012

(54) LIGHT EMITTING DIODE AND WAFER LEVEL PACKAGE METHOD, WAFER LEVEL BONDING METHOD THEREOF, AND CIRCUIT STRUCTURE FOR WAFER LEVEL PACKAGE

(75) Inventors: Charng-Shyang Jong, Hsinchu (TW); Ming-Sen Hsu, Sinhua Township, Tainan County (TW); Chin-Fu Ku, Shanhua Township, Tainan County (TW); Chih-Ming Chen, Jhubei (TW); Deng-Huei Hwang, Danshuei Township, Taipei County (TW)

(73) Assignees: Epileds Technologies Inc., Tainan County (TW); Silicon Base Developmen Inc., Hsinchu (TW)

( * ) Notice: Subject to any disclaimer, the term of this patent is extended or adjusted under 35 U.S.C. 154(b) by 449 days.

(21) Appl. No.: 11/798,655

(22) Filed: May 16, 2007

(65) Prior Publication Data
US 2008/0099771 A1    May 1, 2008

(30) Foreign Application Priority Data
Oct. 31, 2006  (TW) .................. 95140250 A

(51) Int. Cl.
*H01L 21/00* (2006.01)

(52) U.S. Cl. ............... 438/26; 438/25; 438/28
(58) Field of Classification Search .............. 257/E33.056–E33.062; 438/42, 438/43, 22–29
See application file for complete search history.

(56) References Cited

U.S. PATENT DOCUMENTS
7,436,000 B2 * 10/2008 Kim et al. .................. 257/98
* cited by examiner

*Primary Examiner* — Hung Vu
(74) *Attorney, Agent, or Firm* — WPAT, P.C.; Anthony King

(57) ABSTRACT

This invention discloses a light emitting diode, a wafer level package method, a wafer level bonding method, and a circuit structure for a wafer level package. The light emitting diode includes a package carrier, a conducting material, at least one light emitting diode structure and a package material. The package carrier has at least one package unit and two through holes on the package carrier and corresponding to the package unit. The conducting material is disposed in the through holes and formed at the bottom of the package unit. The light emitting diode structure is formed on a substrate. The substrate having a light emitting diode structure is flipped over in the package unit, and the electrodes of the light emitting diode structure are bonded with the conducting material. After the substrate is removed, a package material is stuffed in the package unit or on the light emitting diode structure.

9 Claims, 11 Drawing Sheets

LIGHT EMITTING DIODE AND WAFER LEVEL PACKAGE METHOD, WAFER LEVEL BONDING METHOD THEREOF, AND CIRCUIT STRUCTURE FOR WAFER LEVEL PACKAGE

BACKGROUND OF THE INVENTION

1. Field of the Invention

The present invention relates to a light emitting diode, and more particularly to a light emitting diode that grows a light emitting diode structure onto a substrate, and uses the substrate as a medium for bonding the light emitting diode structure onto a package carrier to achieve the purpose of producing a light emitting diode with a wafer level package.

2. Description of the Related Art

Referring to FIG. 1 for a schematic view of a conventional surface mount device (SMD) type light emitting diode (LED) package, the SMD-type light emitting diode package structure 1 comprises a cup base 12, a conductive lead frame 13, a light emitting diode structure 11, two conductive wires 14 and 15, and an encapsulation 16, wherein the light emitting diode structure 11 is a semiconductor component that luminesces by an external voltage and includes a p-electrode and an n-electrode and connects two conductive wires 14 and 15 to the conductive lead frame 13. The conductive lead frame 13 is disposed in the base 12, and extended to the external surface of the base 12 and serves as a contact point for the following surface mount process. Traditionally, epoxy, silicone, or light transmitting colloidal fluid is usually filled into the cup base 12 and stuffed onto the light emitting diode structure 11 and the conductive wire 14, 15, and cured into an encapsulation 16 having a protective function for protecting and fixing the light emitting diode structure 11 and the conductive wire 14, 15 during the manufacturing process of the conventional SMD-type light emitting diode package structure 1. However, such manufacturing process or assembly is more complicated, and erroneous alignments may occur easily.

At present, the high-performance, high-power and high-brightness light emitting diode produces a large heat source, and thus most manufacturers usually install a heat dissipating structure to a lead frame when the light emitting diode lead frame is produced, so that the heat produced by the light emitting diode can be dispersed to assure the lifetime of the light emitting diode.

Referring to FIG. 2 for a schematic view of a heat dissipating structure of a conventional light emitting diode, the light emitting diode 2 is a SMD-type including a lead frame 21, 22 having a cathode 211 and an anode 221 and formed by stamping a thin metal substrate. The lead frame 21, 22 further includes a vertical connecting portion 212, 222 separately coupled to the cathode 211 and the anode 221, a solder portion 213, 223 formed at an end of the connecting portion 212, 222 and extended parallel to the cathode 211 and the anode 221, wherein excessive materials of the lead frame 21, 22 are cut away for extrusion, and a heat dissipating structure 23 integrally formed at the bottom of the cathode 211, and the heat dissipating structure 23 is a square cylindrical body 231 having a plurality of equidistant heat dissipating fins 232 formed in the cylindrical body 231 and a heat dissipating passage 233 defined between any two adjacent heat dissipating fins 232. A rack 24 is formed by injection to cover the cathode 211 and the anode 221, such that the solder portion 213, 223 of the lead frame 21, 22 is disposed at the bottom of the rack 24, and the light emitting diode structure 25 is installed at the top of the cathode 211. The light emitting diode structure 25 is soldered and connected to the anode 221 through a conductive wire 26. A light-transmitting mask 27 is packaged on the rack 24 of the corresponding light emitting diode structure 25.

However, the aforementioned shortcomings of the prior art including the complicated manufacturing process and the increased cost of a heat dissipating structure and the occurrence of erroneous alignments still exist. In view of these shortcomings, the inventor of the present invention based on years of experience in the related industry to conduct extensive researches and experiments, and finally developed a light emitting diode in accordance with the present invention to overcome the shortcomings of the prior art.

SUMMARY OF THE INVENTION

The primary objective of the present invention is to overcome the foregoing shortcomings of the prior art by providing a light emitting diode, and more particularly to a light emitting diode that grows a light emitting diode structure onto a substrate, and uses the substrate as a medium for bonding the light emitting diode structure onto a package carrier to achieve the purpose of producing a light emitting diode with a wafer level package.

To achieve the foregoing objective, the light emitting diode of the invention comprises a package carrier, a conducting material, at least one light emitting diode structure and a package material. The package carrier includes at least one package unit and at least two through holes disposed on the package carrier and corresponding to the package unit. The conducting material is disposed in the through holes and formed on the package unit. The light emitting diode structure is grown on a substrate, and installed into the package unit by flipping the substrate over, and the electrodes of the light emitting diode structure are bonded with the conducting material. After the substrate is removed, the package material is stuffed into the package unit or on the light emitting diode structure to complete manufacturing the light emitting diode having a wafer level package in accordance with the present invention. A single light emitting diode or a plurality of light emitting diodes can be obtained by an appropriate cutting process.

The present invention further provides a circuit structure of a wafer level package carrier, and the circuit structure comprises a package carrier and an integrated circuit structure. The package carrier includes at least one package unit and at least two conductive windows disposed on the package carrier and corresponding to the package unit. The integrated circuit structure is installed on the package carrier and corresponding to the package unit, and coupled to the conductive window. The integrated circuit structure includes an active component, a passive component or a combination of the above for controlling or driving the light emitting diode structure in the package unit.

The wafer level package method of a light emitting diode in accordance with the present invention comprises the steps of:
(1) providing a substrate;
(2) forming at least one light emitting diode structure on the substrate;
(3) providing a package carrier that installs at least one package unit, and corresponding to the package unit at least two through holes disposed on the package carrier;
(4) disposing a conducting material into the through holes and forming the conducting material on the package unit;

(5) flipping a substrate having the light emitting diode structure over, such that the light emitting diode structure corresponds to the package unit of the package carrier;

(6) performing a bonding process to bond two electrodes of the light emitting diode structure separately with the conducting material in the package units;

(7) removing the substrate, such that the light emitting diode structure is disposed in the package unit of the package carrier; and (8) stuffing a package material in the package unit or on the light emitting diode structure.

With the aforementioned steps, a wafer level package method of the light emitting diode is achieved.

The wafer level bonding method of a light emitting diode in accordance with the present invention comprises the steps of:

(1) providing a substrate;

(2) forming at least one light emitting diode structure on the substrate;

(3) providing a package carrier that installs at least one package unit, and corresponding to the package unit at least two through holes disposed on the package carrier;

(4) disposing a conducting material into the through holes and forming the conducting material on the package unit;

(5) flipping a substrate having the light emitting diode structure over, such that the light emitting diode structure corresponds to the package unit of the package carrier; and (6) performing a bonding process to bond two electrodes of the light emitting diode structure separately with the conducting material in the package units.

In summation of the description above, the light emitting diode of the present invention is packaged by the wafer level package method to give a precise alignment by the substrate (or wafer) and provide a miniaturized light emitting diode for the package process to improve the production yield rate and the light emitting performance of the light emitting diode. Further, a single light emitting diode structure or a plurality of light emitting diode structures can be obtained by cutting the light emitting diode structures with a wafer level package. In the meantime, the package carrier is preferably made of silicon (Si) for providing better heat dissipating performance, mechanical stress and supporting effect to simplify the complicated process of manufacturing a heat dissipating device on the light emitting diode.

To make it easier for our examiner to understand the technical characteristics and performance of the present invention, we use preferred embodiments with the attached drawings for the detailed description of the invention.

DETAILED DESCRIPTION OF THE PREFERRED EMBODIMENTS

For simplicity, like numerals are used for like elements for the description of the specification of the present invention as follows.

Figure 1:
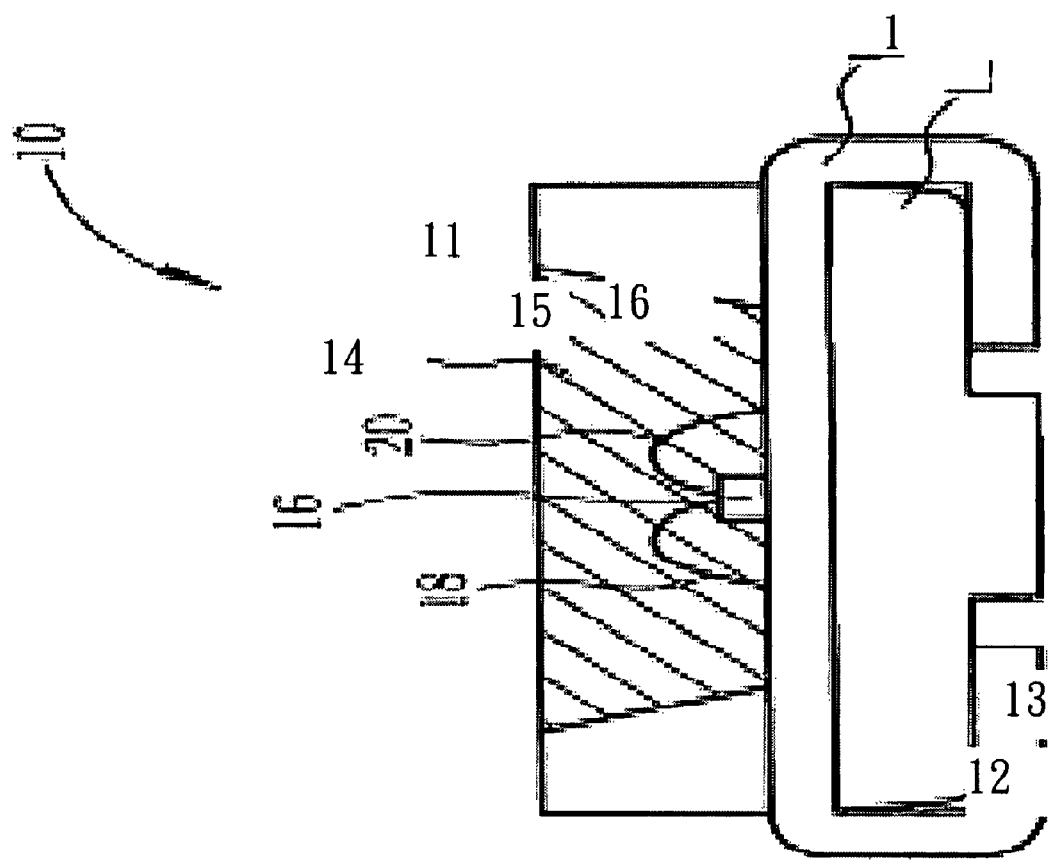
FIG. 1 is a schematic view of a conventional surface mount device (SMD) type light emitting diode (LED) package.
Figure 2:
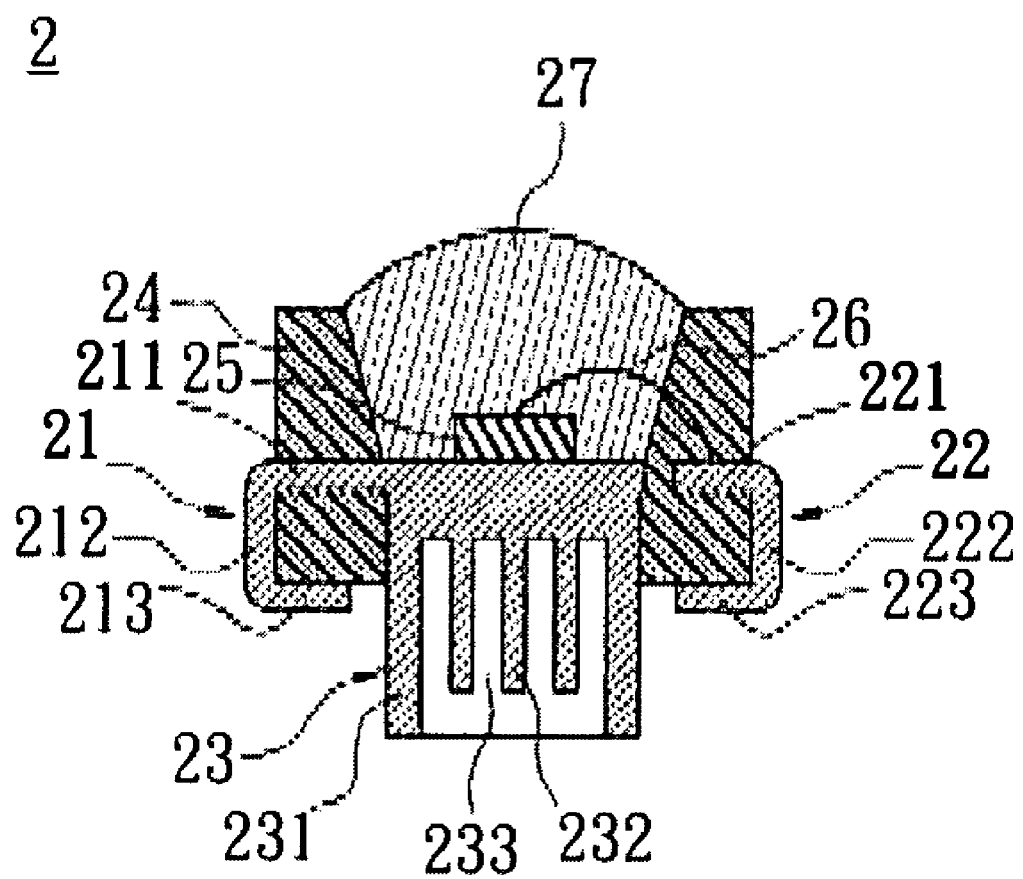
FIG. 2 is a schematic view of a heat dissipating structure of a conventional light emitting diode.
Figure 3:
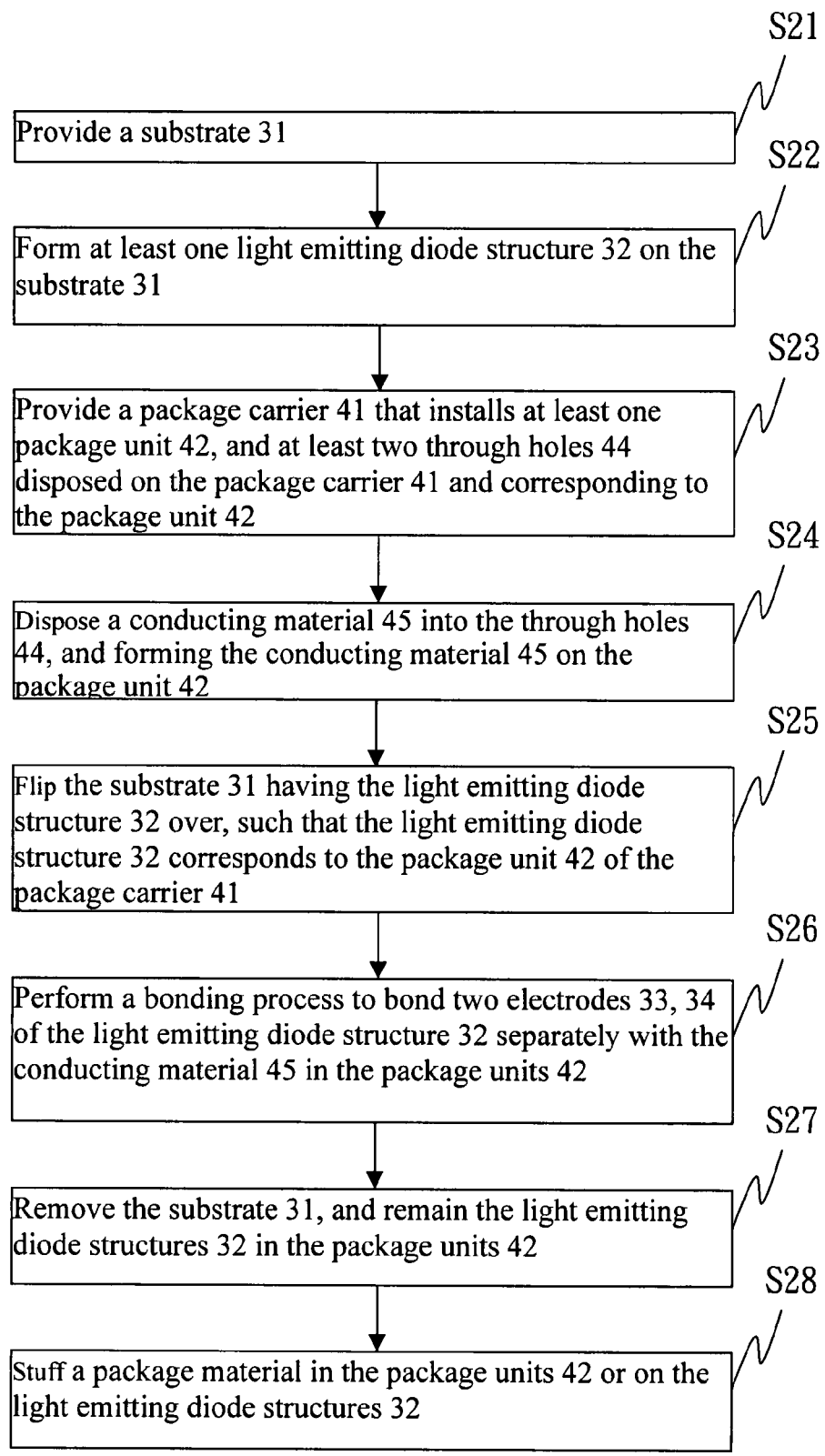
FIG. 3 is a flow chart of a wafer level package method of a light emitting diode in accordance with the present invention.

Referring to FIG. 3 for a flow chart of a wafer level package method of a light emitting diode in accordance with the present invention, the method comprising the steps of:

Step S21: providing a substrate 31;

Step S22: forming at least one light emitting diode structure 32 on the substrate 31;

Step S23: providing a package carrier 41 that installs at least one package unit 42, and at least two through holes 44 disposed on the package carrier 41 and corresponding to the package unit 42;

Step S24: disposing a conducting material 45 into the through holes 44, and forming the conducting material 45 on the package unit 42;

Step S25: flipping the substrate 31 having the light emitting diode structure 32 over, such that the light emitting diode structure 32 corresponds to the package unit 42 of the package carrier 41;

Step S26: performing a bonding process to bond two electrodes 33, 34 of the light emitting diode structure 32 separately with the conducting material 45 in the package units 42;

Step S27: removing the substrate 31, and remaining the light emitting diode structures 32 in the package units 42; and Step S28: stuffing a package material in the package units 42 or on the light emitting diode structures 32.

With the aforementioned steps, the wafer level package method of a light emitting diode is achieved.

The substrate is preferably made of LiTaO3, LiNBO3, Li2B4O3, La3Ga5SiO14, Al2O3, ZnO, GaAs, AlN, InAs or Si, and the plurality of light emitting diode structures disposed on the substrate emit at least one color light, and provide different color lights by a combination of color lights to meet the industrial requirements. The package carrier is preferably made of silicon (Si) to provide better heat dissipating performance, mechanical stress and supporting effect. The package carrier further includes different circuit structures, such as a through hole of an electrode of the same polarity, for connecting the electrodes in parallel, or installing a control circuit of the light emitting diode. The conducting material preferably includes copper, silver, gold or any conducting metal, and the bonding process preferably includes a direct bonding, an anodic bonding, an eutectic bonding, an adhesive bonding or a glass frit bonding, and the direct bonding is divided into a high-temperature bonding, a low-temperature bonding, a bonding with a dielectric layer or a bonding without a dielectric layer. Further the electrode is a p-electrode or an n-electrode, and the package material preferably includes a light emitting material, epoxy, silicone, other protective material or a combination of the above. The light emitting material preferably includes a phosphorescent light emitting material or a fluorescent light emitting material.

Figure 4:
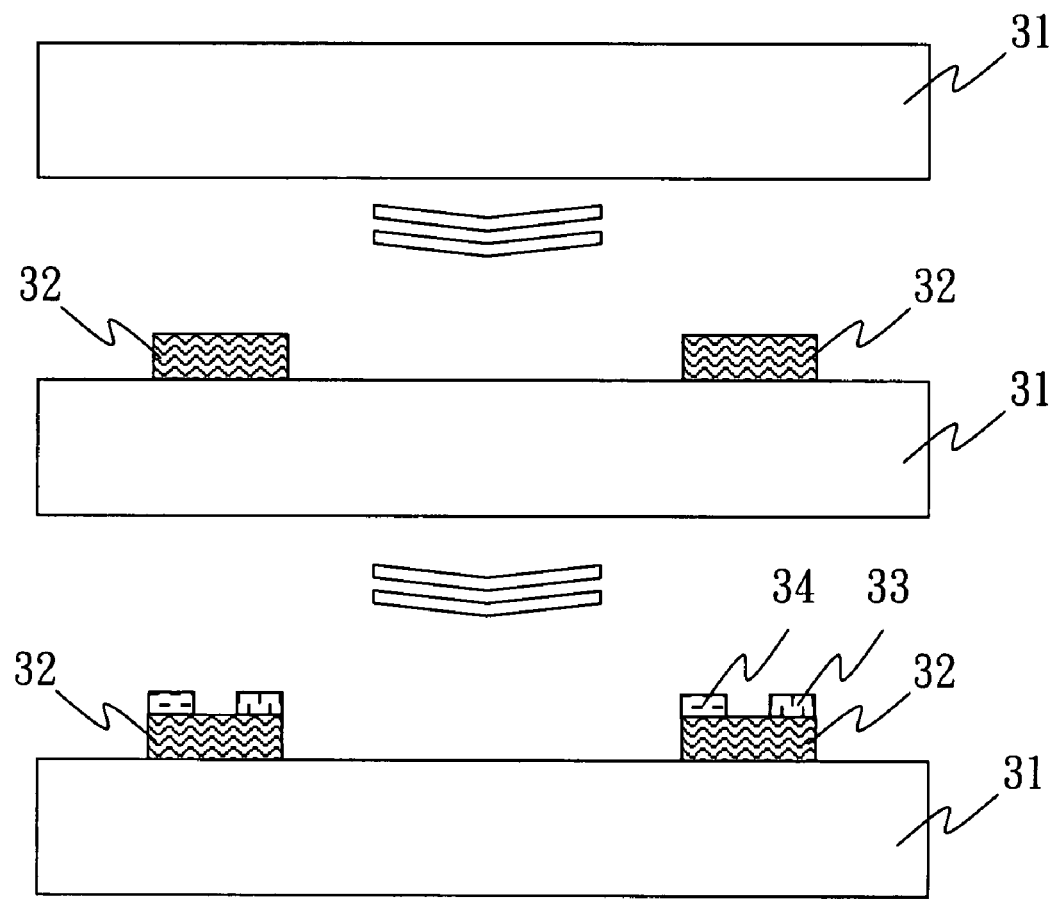
FIG. 4 is a schematic view of a wafer level package method of a light emitting diode in accordance with a preferred embodiment of the present invention.

Referring to FIG. 4 for a schematic view a wafer level package method of a light emitting diode in accordance with a preferred embodiment of the present invention, the wafer level package method comprises the steps of: providing a substrate 31; and growing an LED structure 32 on the substrate 31 and then a p-electrode 33 and an n-electrode 34 on the LED structure 32 to complete manufacturing the substrate 31 having the LED structure 32.

Figure 5:
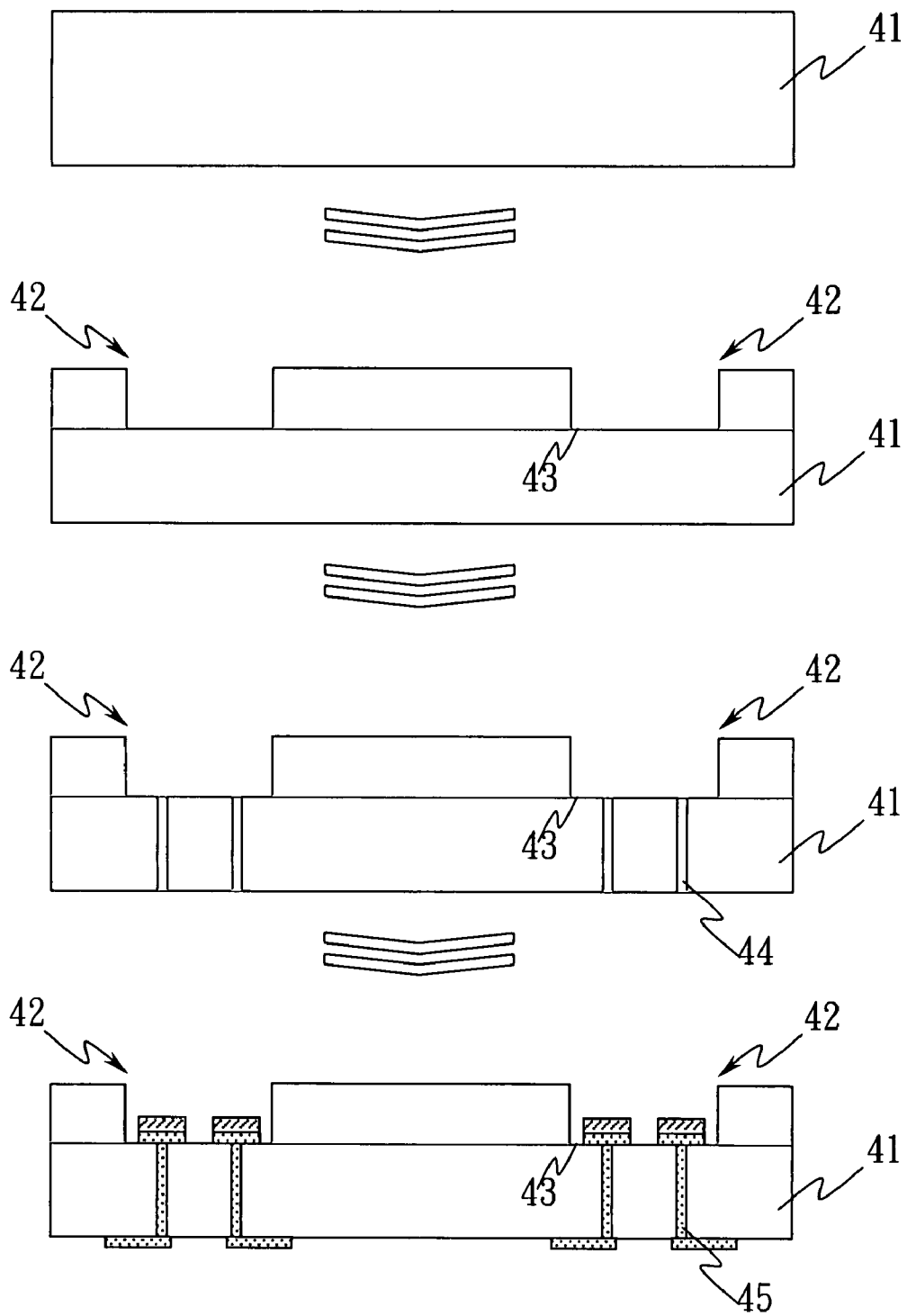
FIG. 5 is a schematic view of a wafer level package method of a light emitting diode in accordance with a preferred embodiment of the present invention.

Referring to FIG. 5 for a schematic view a wafer level package method of a light emitting diode in accordance with a preferred embodiment of the present invention, the wafer level package method comprises the steps of: providing a package carrier 41; forming a package unit 42 on the package carrier 41 and two through holes 44 at the bottom of the package unit 42; disposing a conducting material 45 into the through holes 44, and forming the conducting material 45 at the bottom 43 of the package unit 42 to complete producing the package carrier 41.

Figure 6:
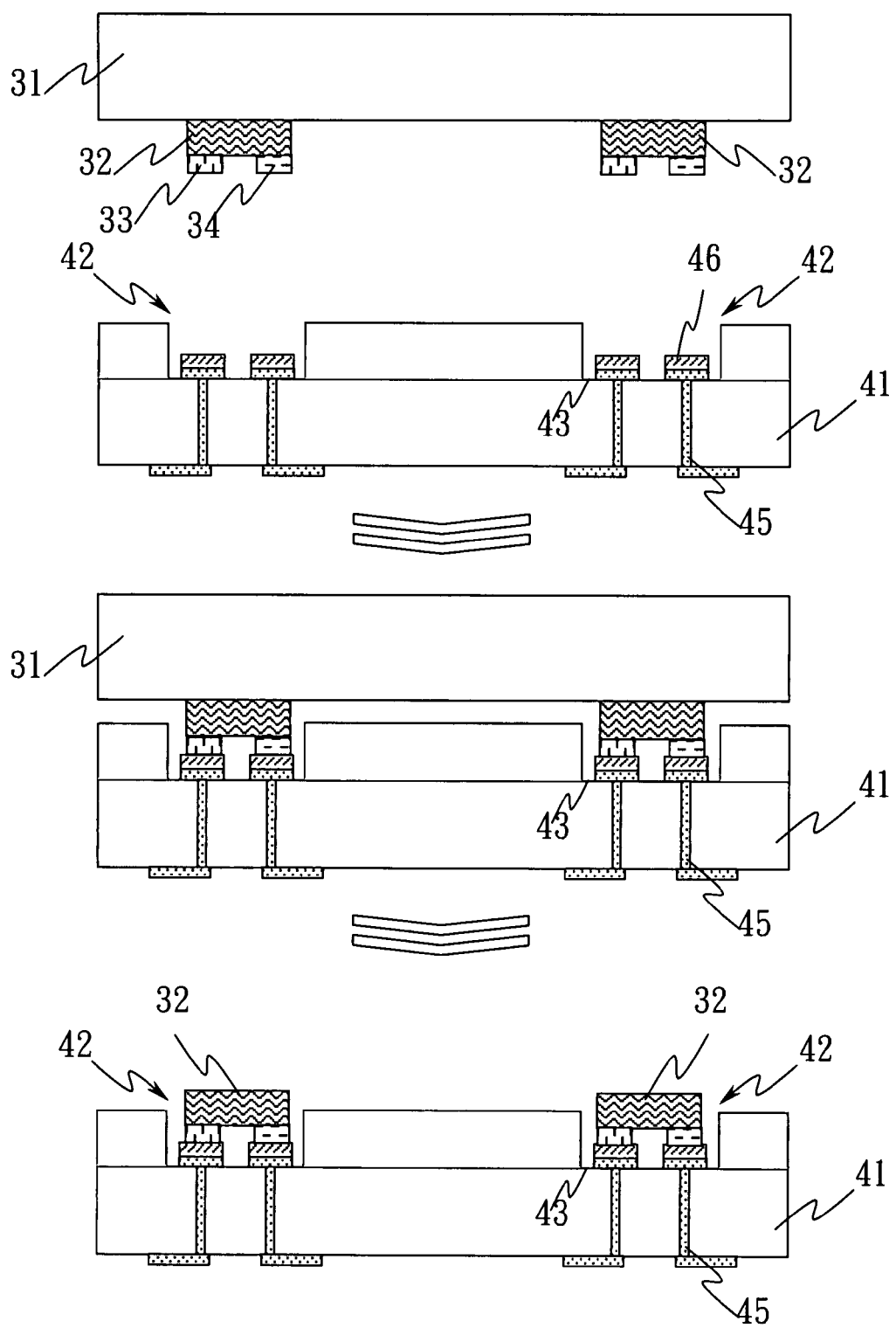
FIG. 6 is a schematic view of a wafer level package method of a light emitting diode in accordance with a preferred embodiment of the present invention.

Referring to FIG. 6 for a schematic view a wafer level package method of a light emitting diode in accordance with a preferred embodiment of the present invention, the wafer level package method comprises the steps of: flipping the substrate 31 having the LED structure 32 as shown in FIG. 4 over and placing the substrate 31 on the package carrier 41 as shown in FIG. 6 for aligning the LED structure 32 to the package unit 42 of the package carrier 41, and bonding two electrodes 33, 34 of the LED structure 32 separately with the conducting material 45 in the package unit 42 by an eutectic bonding technology, After the bonding is completed, the substrate 31 is removed, and the LED structure 32 is remained in the package unit 42 of the package carrier 41.

Figure 7:
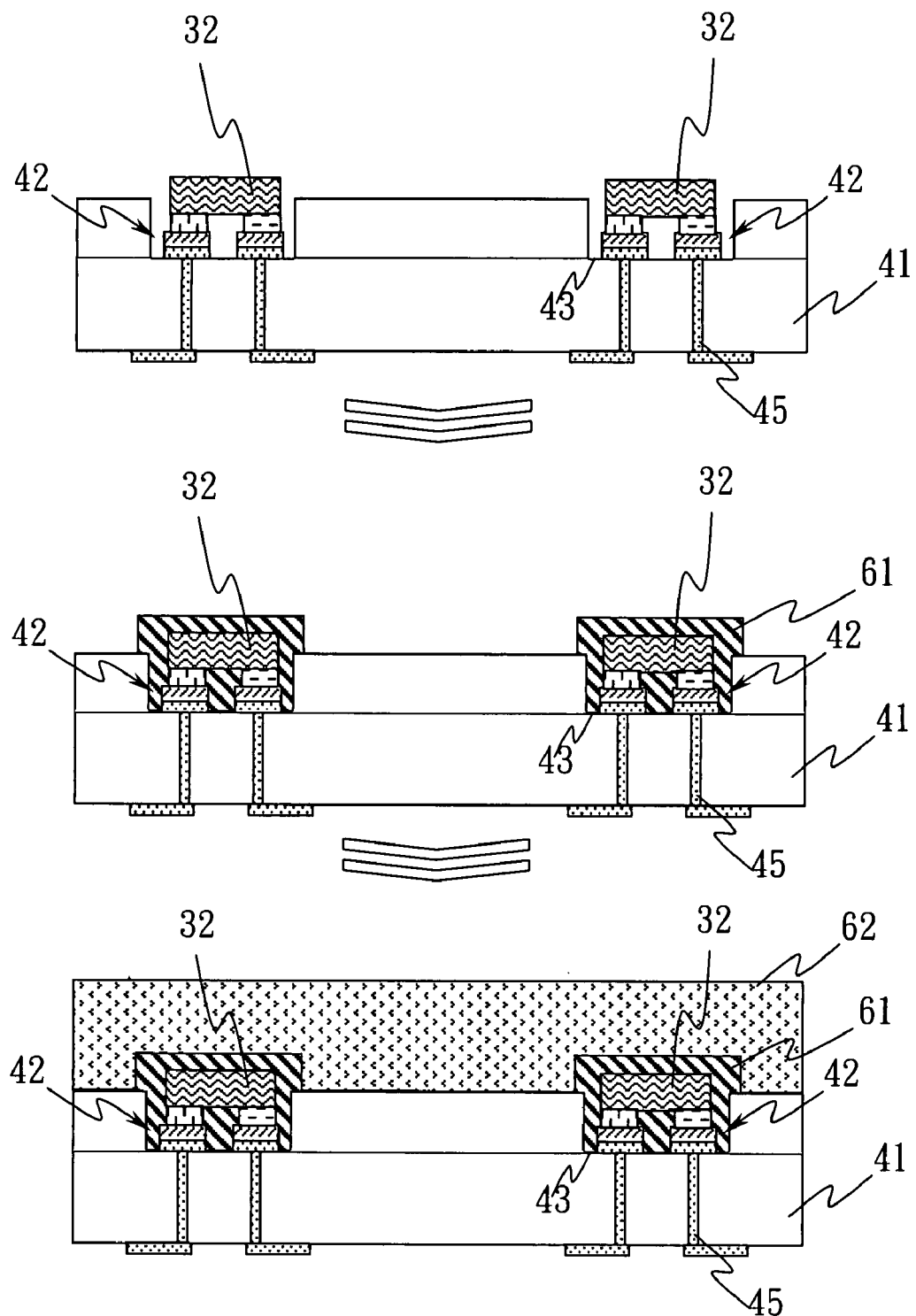
FIG. 7 is a schematic view of a wafer level package method of a light emitting diode in accordance with a preferred embodiment of the present invention.

Referring to FIG. 7 for a schematic view of a wafer level package method of a light emitting diode in accordance with a preferred embodiment of the present invention, the package carrier 41 of the LED structure 32 as shown in FIG. 4 coats a light emitting material 61 in the package unit 42 and a package material 62 on the LED structure 32 to complete producing a wafer level package of a light emitting diode.

Figure 8:
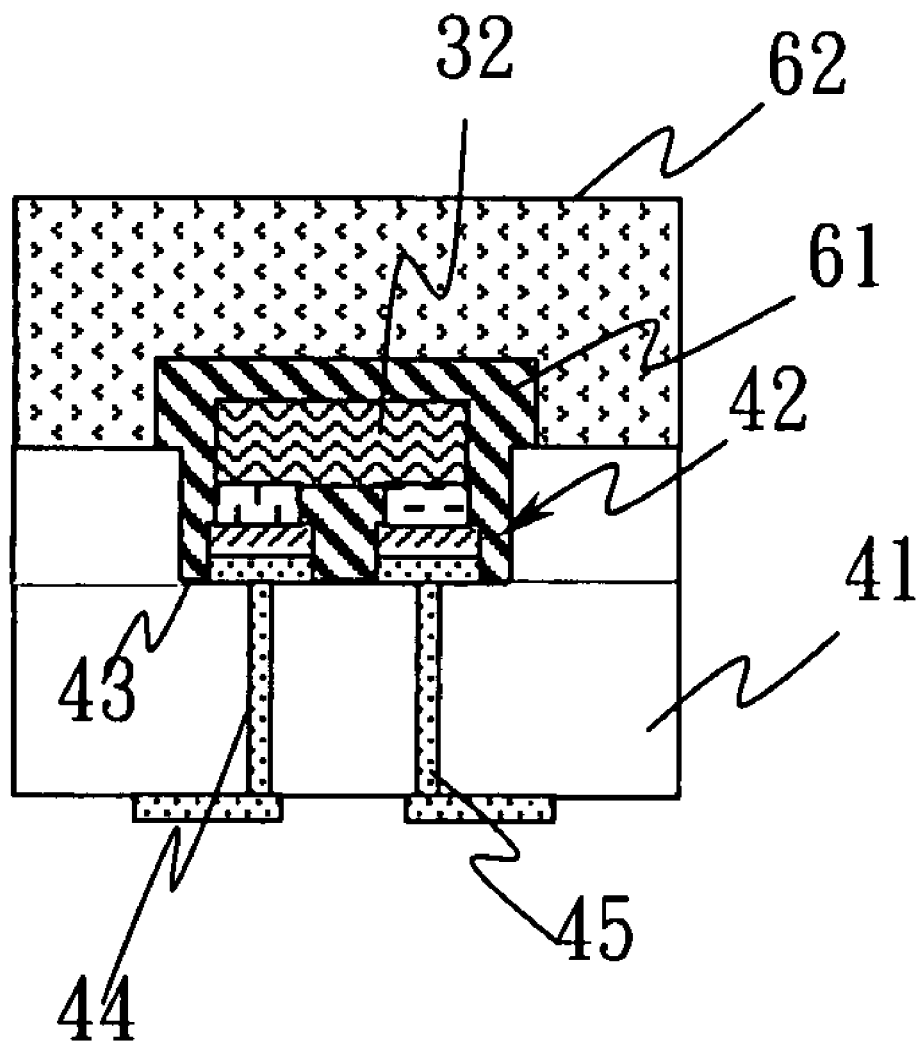
FIG. 8 is a schematic view of a light emitting diode of the present invention.

Referring to FIG. 8 for a schematic view of a light emitting diode of the present invention, the light emitting diode 7 comprises a package carrier 41, a conducting material 45, a light emitting diode structure 32 and a light emitting material 61 or a package material 62. The package carrier 41 installs a package unit 42, and its bottom 43 has two through holes 44. The conducting material 45 is placed into the through hole 44, such that the conducting material 45 is formed at the bottom 43 of the package unit 42. The light emitting material 61 or package material 62 is stuffed in the package unit 42 or on the light emitting diode structure 32.

The substrate is preferably made of LiTaO3, LiNBO3, Li2B4O3, La3Ga5SiO14, Al2O3, ZnO, GaAs, AlN, InAs or Si, and the package carrier is preferably made of silicon (Si) to provide better heat dissipating performance, mechanical stress and supporting effect. The package carrier further installs different circuit structures, such as a through hole of an electrode of the same polarity, for connecting the electrodes in parallel, or installing a control circuit of the light emitting diode. The conducting material preferably includes copper, silver, gold or any conducting metal, and the electrodes include a p-electrode and an n-electrode. Further, the package material preferably includes a light emitting material, epoxy, silicone, other protective material or a combination of the above. The light emitting material preferably includes a phosphorescent light emitting material or a fluorescent light emitting material.

Figure 9:
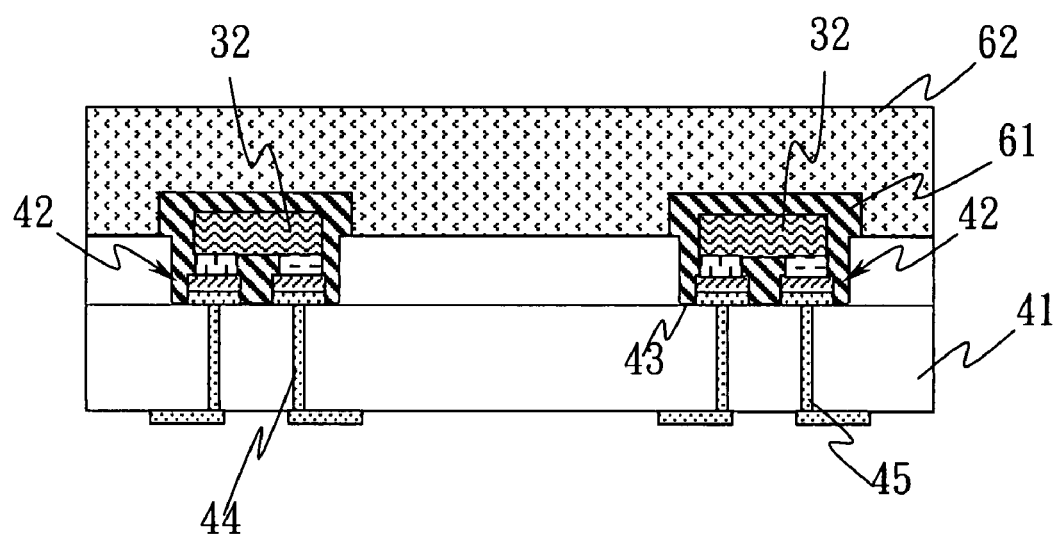
FIG. 9 is a schematic view of another light emitting diode of the present invention.

Referring to FIG. 9 for a schematic view of another light emitting diode of the present invention, the light emitting diode 8 comprises a package carrier 41, a conducting material 45, a plurality of light emitting diode structures 32 and a light emitting material 61 or a package material 62. The package carrier 41 includes a plurality of package units 42, and its bottom 43 has at least two through holes 44, and the conducting material 45 is placed into the through holes 44 to form the conducting material 45 at the bottom 43 of the package unit 42. The light emitting material 61 or package material 62 is stuffed in the package unit 42 or on the light emitting diode structure 32 to achieve the light emitting diode 8 having a plurality of light emitting diode structures 32, or obtain a light emitting diode 7 of a single light emitting diode structure 32 by an appropriate cutting.

The substrate preferably includes LiTaO3, LiNBO3, Li2B4O3, La3Ga5SiO14, Al2O3, ZnO, GaAs, AlN, InAs or Si, and the package carrier is preferably made of silicon (Si) to provide better heat dissipating performance, mechanical stress and supporting effect. The package carrier further installs different circuit structures, such as a through hole of an electrode of the same polarity, for connecting the electrodes in parallel, or installing a control circuit of the light emitting diode. The conducting material preferably includes copper, silver, gold or any conducting metal, and the electrodes include a p-electrode and an n-electrode. Further, the package material preferably includes a light emitting material, epoxy, silicone, other protective material or a combination of the above. The light emitting material preferably includes a phosphorescent light emitting material or a fluorescent light emitting material.

Figure 10:
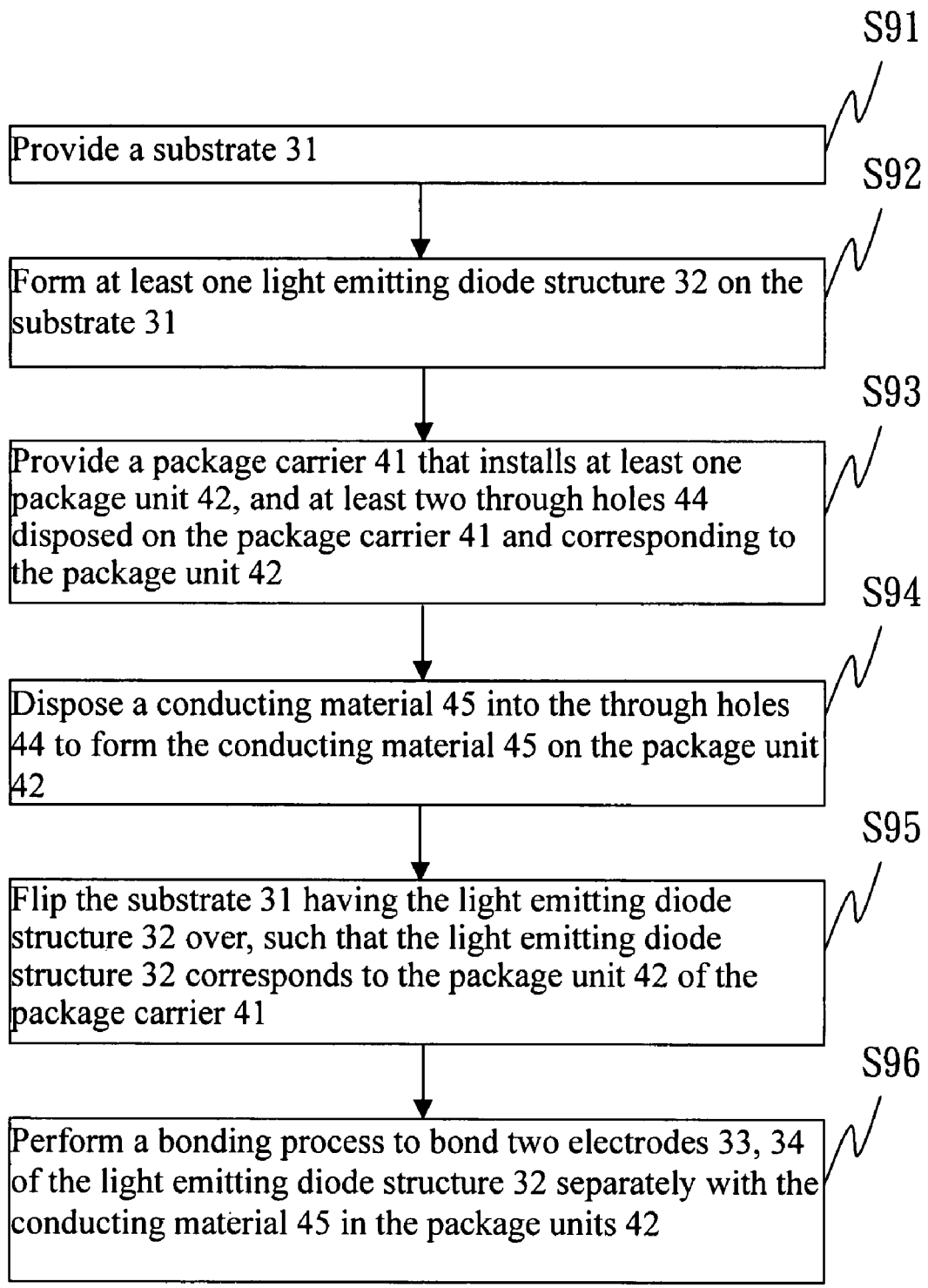
FIG. 10 is a flow chart of a wafer level bonding method of a light emitting diode in accordance with the present invention.

Referring to FIG. 10 for a flow chart of a wafer level bonding method of a light emitting diode in accordance with the present invention, the method comprises the steps of:

Step S91: providing a substrate 31;

Step S92: forming at least one light emitting diode structure 32 on the substrate 31;

Step S93: providing a package carrier 41 that installs at least one package unit 42, and at least two through holes 44 disposed on the package carrier 41 and corresponding to the package unit 42;

Step S94: disposing a conducting material 45 into the through holes 44 to form the conducting material 45 on the package unit 42;

Step S95: flipping the substrate 31 having the light emitting diode structure 32 over, such that the light emitting diode structure 32 corresponds to the package unit 42 of the package carrier 41; and Step S96: performing a bonding process to bond two electrodes 33, 34 of the light emitting diode structure 32 separately with the conducting material 45 in the package units 42.

With the aforementioned steps, the wafer level bonding method of a light emitting diode is achieved.

The substrate is preferably made of LiTaO3, LiNBO3, Li2B4O3, La3Ga5SiO14, Al2O3, ZnO, GaAs, AlN, InAs or Si, and the substrate has a plurality of light emitting diode structures that emit at least one color light, and obtain different color lights by a combination of the light emitting diodes to meet the industrial requirements. The package carrier is preferably made of silicon (Si) to provide better heat dissipating performance, mechanical stress and supporting effect. The package carrier further installs different circuit structures, such as a through hole of an electrode of the same polarity, for connecting the electrodes in parallel, or installing a control circuit of the light emitting diode. The conducting material preferably includes copper, silver, gold or any conducting metal, and the bonding process preferably includes a direct bonding, an anodic bonding, an eutectic bonding, an adhesive bonding or a glass frit bonding, and the direct bonding is divided into a high-temperature bonding, a low-temperature bonding, a bonding with a dielectric layer or a bonding without a dielectric layer. Further, the electrodes include a p-electrode and an n-electrode.

Figure 11:
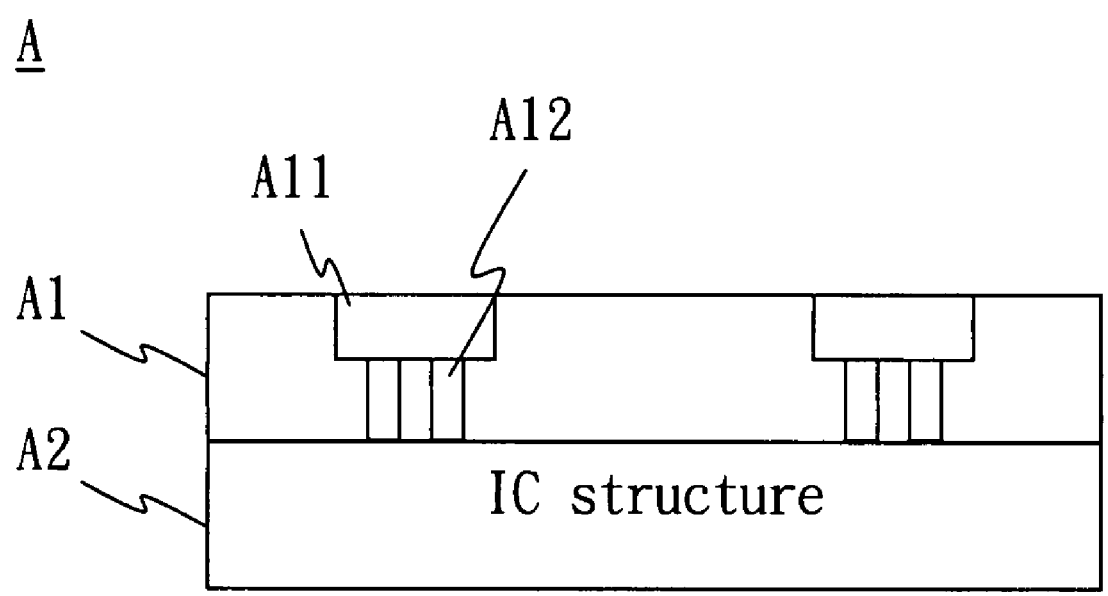
FIG. 11 is a schematic view of a circuit structure of a wafer level package carrier in accordance with the present invention.

Referring to FIG. 11 for a schematic view of a circuit structure of a wafer level package carrier in accordance with the present invention the circuit structure A of the package carrier comprises a package carrier A1 and an integrated circuit structure A2. The package carrier A1 has at least one package unit A11 disposed thereon, and at least two conductive windows A12 disposed on the package carrier A1 and corresponding to the package unit A11. The integrated circuit structure A2 is disposed at the bottom of the package carrier A1 and corresponding to the package unit A11, and coupled to the conductive window A12. The integrated circuit structure A2 includes an active component, a passive component or a combination of the above.

The package carrier is preferably made of silicon (Si) to provide better heat dissipating performance, mechanical stress and supporting effect. The conductive window preferably includes a conducting material such as copper, silver, gold or any conducting metal. The active component of the integrated circuit structure is generally a component related to the direction of current, such as a transistor, a silicon controlled rectifier, a diode or a valve. The passive component is generally a component not related to the direction of current, such as a resistor, a capacitor, or an inductor. The active component, the passive component or their combination is provided for controlling or driving a light emitting diode structure installed in the package unit.

The description and its accompanied drawings are used for describing preferred embodiments of the present invention, and it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wafer level bonding method of a light emitting diode, comprising the steps of:

providing a wafer as a substrate;

growing at least one light emitting diode structure on said substrate;

providing a package carrier, with at least one package unit installed thereon, and at least two through holes disposed on said package carrier and corresponding to said package units;

disposing a conducting material in said through holes, and forming said conducting material on said package unit;

performing a bonding process, for bonding two electrodes of said light emitting diode structure with said conducting material in said package units respectively; and removing said substrate to set said light emitting diode structures in said package units;

wherein said bonding process is a direct bonding, an anodic bonding, eutectic bonding, adhesive bonding or glass frit bonding.

2. The wafer level bonding method of a light emitting diode of claim 1, wherein said light emitting diode structure emits at least one color light.

3. The wafer level bonding method of a light emitting diode of claim 1, wherein said package carrier is made of silicon (Si).

4. The wafer level bonding method of a light emitting diode of claim 1, wherein said package carrier further comprises different circuit structures.

5. The wafer level bonding method of a light emitting diode of claim 1, wherein said conducting material is copper, silver, gold or any conducting metal.

6. The wafer level bonding method of a light emitting diode of claim 1, wherein said direct bonding is divided into a high-temperature bonding, a low-temperature bonding, a bonding with a dielectric layer, or a bonding without a dielectric layer.

7. The wafer level bonding method of a light emitting diode of claim 1, wherein said electrode is a p-electrode or an n-electrode.

8. The wafer level bonding method of a light emitting diode of claim 1, further comprising a step of stuffing a package material in said package unit or on said light emitting structure, and wherein said package material is a light emitting material, epoxy, silicone, other protective material or a combination of the above.

9. The wafer level bonding method of a light emitting diode of claim 1, wherein said light emitting material is a phosphorescent light emitting material or a fluorescent light emitting material.

* * * * *